(12) United States Patent
Izawa et al.

(10) Patent No.: US 6,506,687 B1
(45) Date of Patent: Jan. 14, 2003

(54) DRY ETCHING DEVICE AND METHOD OF PRODUCING SEMICONDUCTOR DEVICES

(75) Inventors: Masaru Izawa, Hino (JP); Shinichi Tachi, Sayama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/720,080

(22) PCT Filed: Jun. 24, 1998

(86) PCT No.: PCT/JP98/02810
§ 371 (c)(1),
(2), (4) Date: Dec. 20, 2000

(87) PCT Pub. No.: WO99/67816
PCT Pub. Date: Dec. 29, 1999

(51) Int. Cl.[7] .............................................. H01L 21/00
(52) U.S. Cl. .................... 438/729; 438/728; 438/732; 156/345.42; 156/345.46; 156/345.48; 156/345.51; 156/915; 216/67; 216/70
(58) Field of Search ................................ 438/710, 719, 438/720, 723, 726, 728, 729, 730, 732; 156/345.36, 345.42, 345.46, 345.48, 345.51, 345.54, 915; 216/67, 68, 69, 70

(56) References Cited

U.S. PATENT DOCUMENTS 5,552,124 A * 9/1996 Su .......................... 156/915 X
5,919,332 A * 7/1999 Koshiishi et al. ....... 156/915 X
6,125,788 A * 10/2000 Hills et al. .............. 156/915 X

FOREIGN PATENT DOCUMENTS

| JP | 6-13344 | 1/1994 |
|----|---------|--------|
| JP | 6-151367 | 5/1994 |
| JP | 6-163462 | 6/1994 |
| JP | 7-58087 | 3/1995 |
| JP | 8-335568 | 12/1996 |
| JP | 9-283498 | 10/1997 |
| JP | 10-144662 | 5/1998 |

* cited by examiner

Primary Examiner—William A. Powell
(74) Attorney, Agent, or Firm—Mattingly, Stanger & Malur, P.C.

(57) ABSTRACT

A technique of dry etching the surface of a wafer by using a dry etching apparatus in which the distance between a wafer and a surface facing the wafer is set to the half or less of the diameter of the wafer is disclosed. Even in the case of using, especially, a wafer having a large diameter, the incident amount of etching reaction by-products in the peripheral portion of the wafer and that in the center portion of the wafer are uniformed. Thus, a uniform etching process over the whole surface of the wafer can be realized.

44 Claims, 10 Drawing Sheets

DRY ETCHING DEVICE AND METHOD OF PRODUCING SEMICONDUCTOR DEVICES

BACKGROUND OF THE INVENTION

1. Field of the Invention

The present invention relates to a dry-etching apparatus for fine-etching a semiconductor device and a method of fabricating a semiconductor device by forming interconnection and the like by dry etching.

2. Description of the Related Arts

One of techniques for fine-etching a semiconductor device is a dry etching technique. In dry etching, an etching gas is introduced into a vacuum chamber, a high-frequency bias or $\mu$ wave is applied to the gas to generate a plasma, the plasma of the etching gas is generated, and a thin film such as a polysilicon film or an Al—Cu—Si film formed on a semiconductor wafer is etched by radicals and ions generated in the plasma. A photoresist film on which a mask pattern is transferred is formed on the thin film, and only the portion which is not covered with the photoresist film is removed by dry etching, thereby forming a semiconductor device structure in which interconnections, electrodes, and the like are integrated on the wafer.

An etching mechanism in dry etching will be briefly described by using an example of etching an Si film with chlorine gas. The chlorine gas introduced in an etching apparatus and chlorine radicals generated in the plasma are adhered on the surface of Si. Cations generated in the plasma are also incident on the surface, so that the surface is locally heated. By the heating, Si reacts with chlorine to form a reaction by-product and is desorbed. By repeating the above, etching on the Si film progresses.

In a pressure region where etching is usually performed, since the mean free path of the reaction by-product is equal to or shorter than 1 cm and is short as compared with the size (height of about 20 cm) of the etching apparatus, the reaction by-product generated on the surface of the wafer has a diffusion phenomenon by collision with other gas molecules. Consequently, the reaction by-product has the probability that it is incident on the wafer. When the incident reaction by-product is adhered, the progress of etching is disturbed. In the case where an incident flux of the reaction by-product has a distribution in the wafer surface, since etch rate decreases where the incident amount is large, it is difficult to perform uniform etching in the wafer surface.

With respect to the incident flux of the reactive by-product in the center portion and that in a peripheral portion of the wafer, although the center portion is surrounded by a reaction by-product generating portion, the peripheral portion has the reaction by-product generating portion only on one of the sides. The incident flux of the reaction by-product in the wafer center portion is less than that in the wafer peripheral portion. As a result, in an etching apparatus of a uniform ion incident amount, the etch rate in the wafer peripheral portion is higher than that in the peripheral portion. Further, the reaction by-products are adhered on side faces of a pattern. When the adhering amount is large, the pattern becomes thick. When the adhering amount is small, side-etching occurs. In order to uniform an etched shape in the wafer surface, it is therefore necessary to uniform the incident amount of the reaction by-products. To be more accurate, since a chip is not formed in the region of about 3 mm of the periphery of the wafer, it is necessary to uniform the incident amount of the reaction by-products in the region except for the periphery of 3 mm of the wafer.

In a conventional etching apparatus, the distribution of the incident flux of the reaction by-products is controlled by optimizing a gas flow, installing a focusing ring, and the like. However, as the gas pressure in the etching process is becoming lower, it is becoming difficult to improve the uniformity only by the gas flow. When a focusing ring is installed to distribute plasma density, in association with increase in wafer diameter, an excessive distribution occurs in the plasma density, a charge distribution occurs in the wafer surface, and the probability that the semiconductor device is destroyed increases. Further, as the diameter of the wafer increases, the height of the focusing ring has to be increased. When the height is increased, however, the reaction by-product is adhered to the focusing ring and becomes a cause of a foreign matter and a particle. That is, in the conventional etching apparatus, it is difficult to uniformly process a wafer having a large diameter of about 12 inches.

SUMMARY OF THE INVENTION

It is an object of the invention to provide a dry etching apparatus capable of obtaining a uniform etch rate and a uniform etched shape in a wafer surface by uniforming the number of re-incident times of a reaction by-product and a method for fabricating a semiconductor device, having such a dry etching process.

The object is achieved by uniforming the thickness of a near-surface region. Specifically, at the time of etching a wafer of a large diameter, the distance between the wafer and a member facing the wafer to a predetermined value, thereby uniforming a distribution in the surface, of the thickness of the near-surface region.

First, the incident mechanism of the reaction by-product will be described. The reaction by-product generated on the wafer moves according to a diffusion phenomenon. To be specific, since the mean free path of the product generated on the wafer is about 1/100 of the size of the etching apparatus, the product collides with gas molecules in the apparatus. By the collision, the moving direction of the reaction by-products changes and a part of the reaction by-products moves toward the wafer. Even if the movement can be maintained in the direction of moving apart from the wafer, the reaction by-products again collide with the gas molecules. As a result, the moving direction of the reaction by-products changes and the reaction by-products are incident on the wafer again and again. By such a diffusion phenomenon, the concentration of the reaction by-products becomes high near the wafer and decreases with distance from the wafer. According to the diffusion theory, the distance of the region in which the concentration of the reaction by-products from the wafer is equal to about the radius of the wafer. On the other hand, the distribution of the reaction by-products is almost uniform in a region apart from the wafer by the radius of the wafer. The concentration of the reaction by-products in the region apart from the wafer is determined substantially by residence time of the reaction by-products. The region near the wafer in which the concentration of the reaction by-products is higher than the concentration determined by the residence time will be called a near-surface region. The thickness of the near-surface region changes, as will be described hereinlater, depending on the position of the wafer, gas pressure, and gas flow rate.

As described above, by forming the near-surface region, the reaction by-products are incident on the wafer again and again. The number of colliding times of the reaction by-products with the gas molecules in the near-surface region is obtained by a mean free path (L) to the thickness (D) of the near surface region, that is, D/L. Since the probability that the reaction by-products move in the direction toward the wafer and the probability that the reaction by-products move in the direction apart from the wafer by a single collision are equal to each other, in the half of the D/L times of collisions, the reaction by-products are incident on the wafer. That is, the number of re-incident times is obtained by D/2L from the thickness (D) of the near-surface region and the mean free path (L).

In the case where the portion facing the wafer has a shower-plate structure for introducing gas, when the gas flow rate increases, the near-surface region becomes smaller, and the number of re-incident times of the reaction by-products (re-incident number of times) decreases according to a diffusion equation. When the gas pressure is increased, the diffusion coefficient of the reaction by-products becomes smaller, so that the near-surface region is narrowed. When the gas flow rate increases by 100 sccm, the thickness of the near-surface region is decreased by about 10%. When the gas pressure increases by 1 Pa, the thickness of the near-surface region is decreased by about 5%. When the gas flow rate is expressed as Q(sccm) and the gas pressure is expressed as P(Pa), the thickness Dc of the near-surface region in the center portion of the wafer is substantially obtained with respect to the radius (R) of the wafer as follows.

$$Dc = R \times 0.9^{(Q-100)/100} \times 0.95^{(P-1)}$$

The number of re-incident times is proportional to the thickness of the near-surface region and the mean free path L is inverse proportional to the gas pressure. Consequently, the number of re-incident times (n=Dc/2L) increases with the gas pressure and starts decreasing at the high gas flow rate. The wafer does not always have a perfect circle shape. In the case where the wafer does not have a complete circle shape, the radius of the wafer is defined as the half of the longest distance from end to end of the wafer.

Since the reaction by-products are generated around the center portion of the wafer, the thickness of the near-surface region in the center portion of the wafer is about the radius of the wafer. Since no reaction by-product is generated on the outside of the wafer and the wafer peripheral portion serves as an exhaust port, the thickness of the near-surface region in the wafer peripheral portion is about the half of that in the center portion, that is, about the half of the radius of the wafer. FIG. 1 shows the relation between the distance from the center portion of the wafer and the near surface region in the case of etching Al on a 12-inch wafer (having a diameter of 300 mm) with a gas pressure of 1 Pa and a flow rate of $Cl_2+BCl_3$ gas of 300 sccm. When the wafer facing surface is sufficiently apart from the wafer, the near-surface region extends over the wafer as shown by 101 in FIG. 1. The number of re-incident times of reaction by-products is proportional to the near-surface region. In a region where the near-surface region in the wafer center portion is large, the number of re-incident times increases, and the reaction by-products are adhered to a matter to be etched, so that the etch rate becomes low. On the other hand, the near-surface region is small in the peripheral portion of the wafer, the number of re-incident times is small, and the etch rate is high.

In practice, there is a wafer table (processing stand) on which a wafer is placed. When the wafer table is also taken into account, a susceptor exists on the outside of the wafer peripheral portion in order to place the wafer in a fixed position. Consequently, the reaction by-products are reflected by the surface of the susceptor, and a part of the reflected reaction by-products is again incident on the peripheral portion of the wafer. When the radius of the wafer table is larger than the wafer radius by 20 mm, that is, there is a susceptor having a width of 20 mm around the wafer, as shown by the curve 101 in FIG. 1, the near-surface region in the wafer periphery is about ⅔ as compared with that in the center of the wafer. The curve 101 in FIG. 1 showing the distribution in the wafer surface, of the thickness of the near-surface region in the case of 12 inches and the gap of 140 mm or larger corresponds to a curve 201 indicative of the distribution in the wafer surface, of the number of re-incident times in FIG. 2. In this case, as shown by the curve 201 in FIG. 2, the number of re-incident times in the wafer peripheral portion is about ⅔ of that in the wafer center portion. In the near-surface region in the wafer peripheral portion, the effect of returning the reaction by-products decreases with the distance. Consequently, when the width of the susceptor is 170 mm or less, the thickness of the near-surface region is almost proportional to the square root of the width of the susceptor. When the width of the susceptor is 170 mm or wider, the thickness of the near-surface region in the peripheral portion does not change. When the width of the susceptor is 170 mm or less and is expressed as (d), the thickness De of the near-surface region in the wafer peripheral portion is expressed by $De=Dc\times(0.5+\sqrt{d})$. When k denotes a proportionality constant and the unit of (d) is cm, k=0.12.

As described above, since the thickness of the near-surface region is distributed above the wafer, the number of re-incident times of the reaction by-products above the wafer in the wafer peripheral portion is smaller than that in the wafer center portion (curve 101 in FIG. 1). As a result, even if the plasma is uniform, the incident flux of the reaction by-products is distributed. It is therefore difficult for the conventional apparatus to obtain an uniform etched shape at a uniform etch rate.

Since the cause of nonuniformity is nonuniform thickness of the near-surface region above the wafer in such a manner that the near-surface region is thin in the wafer peripheral portion and is thick in the center, by uniforming the near-surface region, the uniformity in the surface can be improved.

When a free space extends over the wafer, the near-surface region can extend to a distance equal to about the radius of the wafer. However, in the case of an apparatus structure in which the distance (gap) between the wafer and the wafer facing surface is shorter than the radius of the wafer, the near-surface region in the wafer center portion is disturbed by the wafer facing surface. When the wafer facing surface is rough and the roughness is small, the gap is between the wafer surface and the portion closest to the wafer surface. When the wafer facing surface is concave or convex, the gap varies according to positions in the wafer. The gap at a position in the wafer is the distance between the wafer and the wafer facing surface on the perpendicular line in the center of the wafer. Unless otherwise specified, the gap will be explained as a gap in the wafer center portion.

Specifically, a 12-inch wafer is used and the thickness of the near-surface region with the gap of 110 mm and that with the gap of 80 mm are indicated by curves 102 and 103 in FIG. 1, respectively. Since the thickness of the near-surface region De in the wafer peripheral portion is about 80 mm, the gap is set to 80 mm and the thickness of the near-surface region in the wafer center portion is adjusted to that in the peripheral portion, thereby uniforming the thickness of the near-surface region above the wafer surface. The curve 102 indicative of the distribution in the wafer surface of the thickness of the near-surface region when the gap is 110 mm in FIG. 1 corresponds to a curve 202 in FIG. 2. The curve 103 indicative of the distribution in the wafer surface of the thickness of the near-surface region when the gap is 80 mm in FIG. 1 corresponds to a curve 203 in FIG. 2. As obviously understood from the comparison between FIGS. 1 and 2, the number of re-incident times of the reaction by-products is proportional to the thickness of the near-surface region. When the plasma is uniform, it is therefore sufficient to adjust the gap so as to be equal to the near-surface region De in the wafer peripheral portion. A desired gap G is formalized as follows by including the gas pressure P, the gas flow rate Q and the wafer radius R on the basis of the equation of the thickness of the near-surface region.

$$G = R \times 0.9^{(Q-100)/100} \times 0.95^{(P-1)} \times (0.5 + k\sqrt{d})$$

As for an effect on improvement in uniformity, when the gap is shorter than the thickness of the near-surface region in the wafer center portion, the gap $G_0$ is expressed as follows.

$$G0 = R \times 0.9^{(Q-100)/100} \times 0.95^{(P-1)}$$

That is, the uniformity is improved with the gap equal to or shorter than $G_0$, and uniformity is achieved when the gap is about G. When the gap is further shortened, nonuniformity may occur again due to occurrence of pressure variations and an unstable plasma. It is therefore desirable to control the uniformity in the range from G to $G_0$.

FIGS. 3, 4, 5, and 6 show the gap dependency of the distribution in the wafer surface of the number of re-incident times with respect to the wafer diameter, gas pressure, gas flow rate, and susceptor width.

FIG. 3 shows the relation between the distribution of the number of re-incident times and the distance between a processing stage and a surface facing the processing stage in the case of performing a plasma process with the gas pressure of 1 Pa and the $Cl_2 + BCl_3$ gas flow rate of 100 sccm. A curve 301 in FIG. 3 is a curve indicative of a distribution in the wafer surface of the number of re-incident times in a 6-inch wafer, a curve 302 is a curve indicative of a distribution in the wafer surface of the number of re-incident times in an 8-inch wafer, a curve 303 is a curve expressing a distribution in the wafer surface of the number of re-incident times in a 12-inch wafer, and a curve 304 is a curve expressing a distribution in the wafer surface of the number of re-incident times in a 16-inch wafer. Since the near-surface region in the wafer peripheral portion is as short as about ⅔ of that in the center portion, as understood from the curve 302 in FIG. 3, in order to make the thickness of the near-surface region in the wafer center portion of the 8-inch wafer almost equal to that in the wafer peripheral portion, it is sufficient to adjust the distance (gap) between the wafer and the wafer facing surface to about 70 mm which is ⅔ of the wafer radius. When the gap is 70 mm, the number of re-incident times is almost uniform. On the other hand, with respect to a 6-inch wafer with the same flow rate, it is sufficient to adjust the gap to about 50 mm as shown by the curve 301. In the case of the 12-inch wafer (curve 303), it is sufficient to adjust the gap to about 100 mm. In the case of a 16-inch wafer, it can be estimated that the number of re-incident times becomes almost uniform when the gap is 130 mm. It is not always necessary to set the distribution of the number of re-incident times to zero. When the distribution is set to 10% or lower, preferably, 5% or lower, the effect on uniformity is improved.

When the gap is narrowed further, although the near-surface region in the wafer peripheral portion is also hindered by the wafer facing surface, the thickness of the near-surface region in the center portion and that in the peripheral portion become almost equal to each other. Consequently, even when the distance between the wafer and the wafer facing surface is set to ⅔ of the radius of the wafer or narrower, the uniformity of the number of re-incident times of the reaction by-products in the wafer surface is improved within the range where the gas pressure in the wafer surface can be held uniform. As described above, by setting the distance between the wafer and the wafer facing surface to ⅔ of the wafer radius or narrower, the incident flux of the reaction by-product becomes uniform, so that the etch rate and the etched shape become uniform in the wafer surface.

However, in the case of using, especially, a parallel plate etching apparatus, when the gap is extremely narrowed to 50 mm or less, the gas pressure distribution in the wafer surface becomes large. Particularly, in the case of a low gas pressure of a few Pa or a high gas flow rate of few hundreds sccm, the gas pressure distribution becomes large and it becomes difficult to assure the etch rate and the uniformity. It is therefore preferable not to extremely narrow the gap.

It is understood from FIG. 4 of the distribution of the number of re-incident times with respect to gas pressure that the gap has to be narrowed as the gas pressure increases. FIG. 4 shows a case where the wafer diameter is 12 inches (300 mm) and the gas flow rate is 300 sccm. In FIG. 4, a curve 401 is a curve indicative of a distribution in the wafer surface of the number of re-incident times with the gas pressure of 0.2 Pa, a curve 402 is a curve indicative of a distribution in the wafer surface of the number of re-incident times with the gas pressure of 1 Pa, a curve 403 is a curve indicative of a distribution in the wafer surface of the number of re-incident times with the gas pressure of 3 Pa, and a curve 404 is a curve indicative of a distribution in the wafer surface of the number of re-incident times with the gas pressure of 5 Pa. When the gas pressure is 1 Pa or lower (curves 401 and 402), the number of re-incident times of the reaction by-products becomes uniform (distribution is almost 0%) with the gap of 80 mm. When the gas pressure is 5 Pa (curve 404), it is necessary to set the gap to about 60 mm. However, when the gap is 60 mm, a gas pressure distribution may occur. Consequently, a low gap pressure is preferable.

FIG. 5 is a diagram showing the gas pressure dependency of the distribution of the number of re-incident times. In FIG. 5, a curve 501 is a curve indicative of a distribution in the wafer surface of the number of re-incident times with a gas flow rate of 100 sccm, a curve 502 is a curve indicative of a distribution in the wafer surface of the number of re-incident times with a gas flow rate of 300 sccm, and a curve 503 is a curve indicative of a wafer in-surface distribution of the re-incident number of times with a gas flow rate of 500 sccm. At the gas flow rate of 500 sccm (curve 503), when the gap is set to 60 mm, the number of re-incident times is not distributed and is uniform.

FIG. 6 shows dependency on the susceptor width of the distribution in the wafer surface of the number of re-incident times. In FIG. 6, a curve 601 is a curve indicative of a distribution in the wafer surface of the number of re-incident times when there is no susceptor. A curve 602 is a curve indicative of a distribution in the wafer surface when the width of the susceptor is 20 mm. A curve 603 is a curve indicative of a distribution in the wafer surface when the width of the susceptor is 50 mm. A curve 604 is a curve indicative of a distribution in the wafer surface when the width of the susceptor is 100 mm. When the width of the susceptor is 20 mm (curve 602), the gap with which the number of re-incident times becomes uniform is about 80 mm. When the width is increased to 50 mm and 100 mm, the necessary gap is widened to 90 mm and 100 mm, respectively.

In the case of the 8-inch wafer, in order to assure uniformity, it is sufficient to set the gap to about 70 mm. In the conventional apparatus structure, however, in some cases, it is difficult to stably generate a high-density plasma. For example, in the parallel plate type etching apparatus, it is difficult to generate the high-density plasma with the gap of 300 mm or wider, and the etch rate becomes extremely low when the gap is 70 mm. In order to compensate the reduction in density, since the reduction in density is caused by decrease in electric field due to diffusion of the plasma and increase in gap, it is necessary to take measures such as the apparatus structure capable of confining the plasma, suppression of the plasma diffusion by application of a magnetic field and increase in high frequency power.

In an apparatus of an inductive coupled type, the plasma generating portion is on the wall side of the processing chamber in the peripheral. Consequently, when the gap is narrowed, the density is lowered in the wafer center portion of, especially, a wafer of a large diameter, and it becomes difficult to generate a uniform plasma. In the case of the etching apparatus of the inductive coupled type, it is therefore necessary to have a structure such that a high-frequency introducing antenna is disposed close to the center portion.

In the case of a magnetic UHF etching apparatus, micro-waves are allowed to propagate into an etching chamber and plasma is generated by electron cyclotron resonance (ECR) of the micro-waves and a magnetic field generated by a solenoid coil provided around the apparatus. Consequently, by controlling the ECR point by the magnetic field, theoretically, high-density plasma can be generated in an arbitrary position on the wafer. When the wafer is disposed close to a micro-wave window positioning in the wafer facing portion, however, since the apparatus itself is a cavity for the micro-waves, resonance cannot be easily obtained and plasma becomes unstable. This can be dealt with by adjusting the height of the cavity in the upper part of the micro-wave window. It is necessary to adjust the height of the cavity of typically about 70 mm to about 150 mm.

On the other hand, in the case of introducing the micro-waves by the antenna in the micro-wave etching apparatus, since the antenna is a resonator, the gap can be freely adjusted. With respect to the increase in wafer diameter, in the case of micro-waves having a wavelength of about 120 mm, there is the possibility that uniformity cannot be assured due to occurrence of a node. On the other hand, in the case of a UHF wave having a wavelength of about 600 mm, there is no such a problem. When high frequencies are introduced by an antenna, however, there is a case that an amount of incident ions increases in the peripheral portion by the electric field in the antenna peripheral portion. It is therefore desirable to set the gap to about 50 mm or wider.

The means for solving the problem in the etching apparatus on the assumption that the apparatus has the shower plate for introducing gas having the wafer facing surface which is almost flat and the susceptor has a height almost equal to that of the wafer and has a width of about 20 mm has been described above. As means for uniforming the near-surface region above the wafer, there are a structure (V-shape or recessed shape) in which the distance between the center portion of the wafer facing surface and the wafer is longer than that in the wafer peripheral portion, a method of widening the susceptor in the wafer peripheral portion and uniforming the near-surface region by a gap wider than $2/3$ of the radius of the wafer, and a method of providing a ring (focusing ring) which is high so as to surround the wafer in the wafer peripheral portion and uniforming the near-surface region by a gap wider than $2/3$ of the radius of the wafer.

Other than the above, there is a method of setting the positions of holes of gas feed of the shower plate in the wafer center portion having a diameter of about $2/3$ to $1/3$ of the wafer diameter, thereby pushing the reaction by-products in the center portion by the flow of the gas and uniforming the near-surface region even with a gap which is wider than $2/3$ of the radius of the wafer.

Although attention has been paid above to the number of re-incident times of the reaction by-products as a factor of determining the distribution of the etch rate, the etch rate also depends on an ion current. The dependency depends on a film to be etched. Although the etch rate of the Al film hardly changes within the range of an ion current (2 to 4 $mA/cm^2$) with which etching is usually performed, in the case of a polysilicon film or an oxide film, the etch rate is almost proportional to an ion current density. With respect to the polysilicon or oxide film etching, consequently, there is a method of uniforming the etch rate in the wafer surface by setting the distribution in the wafer surface of the ion current density so as to open downward in accordance with the distribution of the wafer surface of the number of re-incident times of the reaction by-product.

The control of the distribution of the ion current density differs according to plasma generating means. Specifically, in the case of a magnetic micro-wave etching apparatus or a magnetic UHF etching apparatus each having two or more solenoid coils, by controlling the magnetic field profile, the distribution in the wafer surface of the ion current density is controlled. When the magnetic field profile is set to open upward, the wafer peripheral portion is away from the plasma, so that a distribution which opens downwards is obtained. In the case of an apparatus of an inductive coupled type having a coil antenna of two or more turns, the diameter of the first antenna and that of the second antenna are different from each other. The distribution of the ion current density is controlled by means for applying different currents to the first and second turns or the like. When the current for the antenna having the smaller diameter increases, the curve of the ion current density opens downwards.

When a prior art search was made after completion of the above-described invention, Japanese Unexamined Patent Application No. Hei-9-134906 as a known technique was found. The publication of the known technique describes an apparatus for etching a wafer having a diameter of 200 mm in such a manner that the distance between an upper electrode and a susceptor for holding a wafer, which faces the upper electrode is 70 mm and an $SiO_2$ film is selectively etched for an SiN film. The publication, however, does not suggest the relation between the diameter of the wafer and the gap as described in the present invention.

With the construction, by uniforming the incident flux of the reaction by-product in the wafer surface, uniform etching in the wafer surface can be achieved.

Further, according to the present invention, the processing accuracy of a pattern in the wafer surface is improved, that is, variations in shape in the surface are reduced. Consequently, variations in wiring resistance and capacitance of a semiconductor device and variations in gate length are eliminated. Thus, a semiconductor device having little variations in device characteristics can be easily mass-produced.

DESCRIPTION OF THE PREFERRED EMBODIMENTS

First Embodiment

Figure 1:
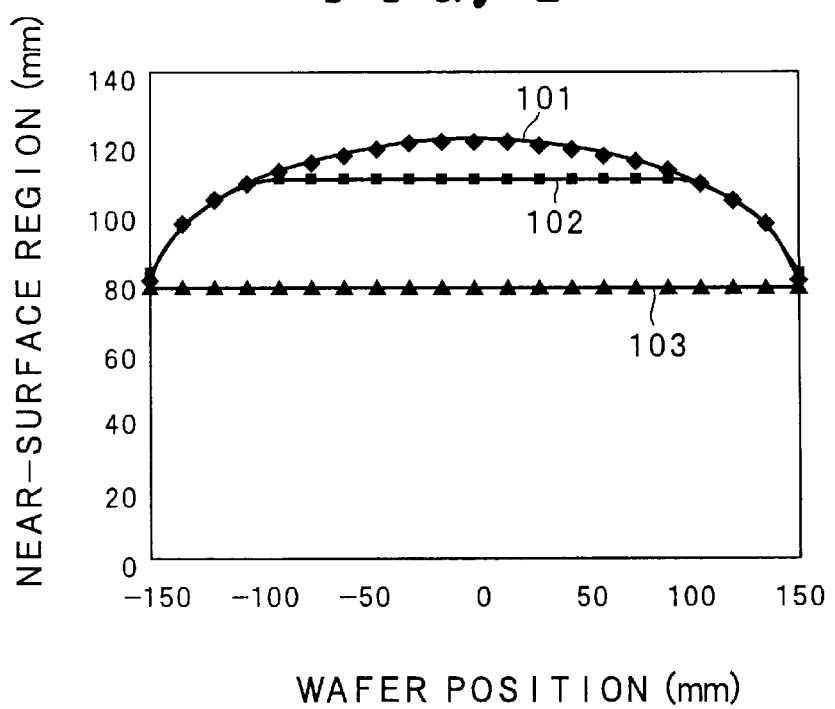
FIG. 1 is a diagram showing gap dependency of a distribution in the wafer surface of a thickness of a near-surface region.
Figure 2:
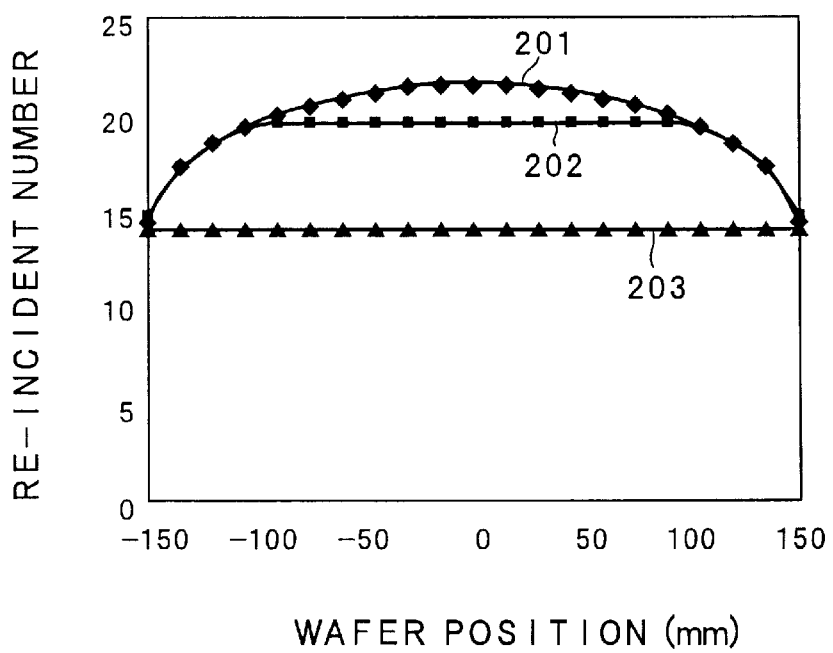
FIG. 2 is a diagram showing gap dependency of a distribution in the wafer surface of the number of re-incident times of a reaction by-product.
Figure 3:
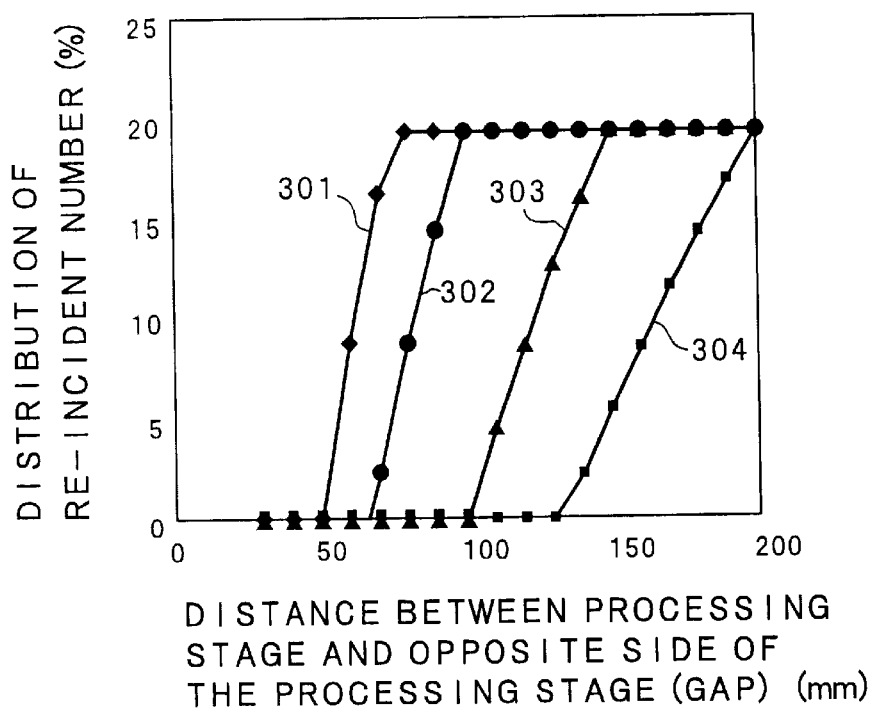
FIG. 3 is a diagram showing gap dependency of a distribution in the wafer surface of the number of re-incident times with respect to some wafer diameters.
Figure 4:
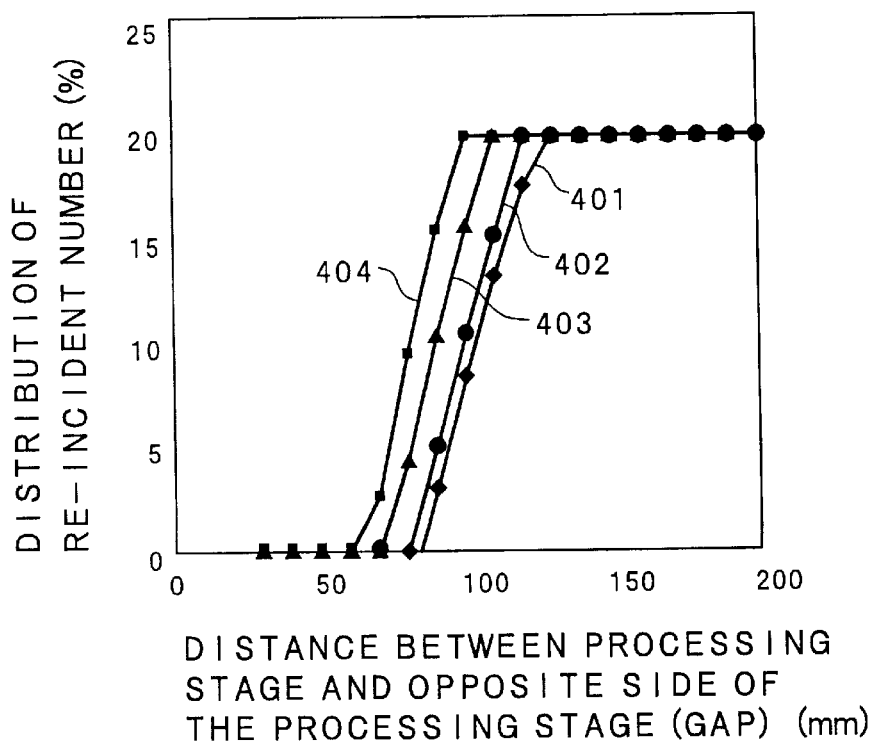
FIG. 4 is a diagram showing gap dependency of a distribution in the wafer surface of the number of re-incident times with respect to some gas pressures.
Figure 5:
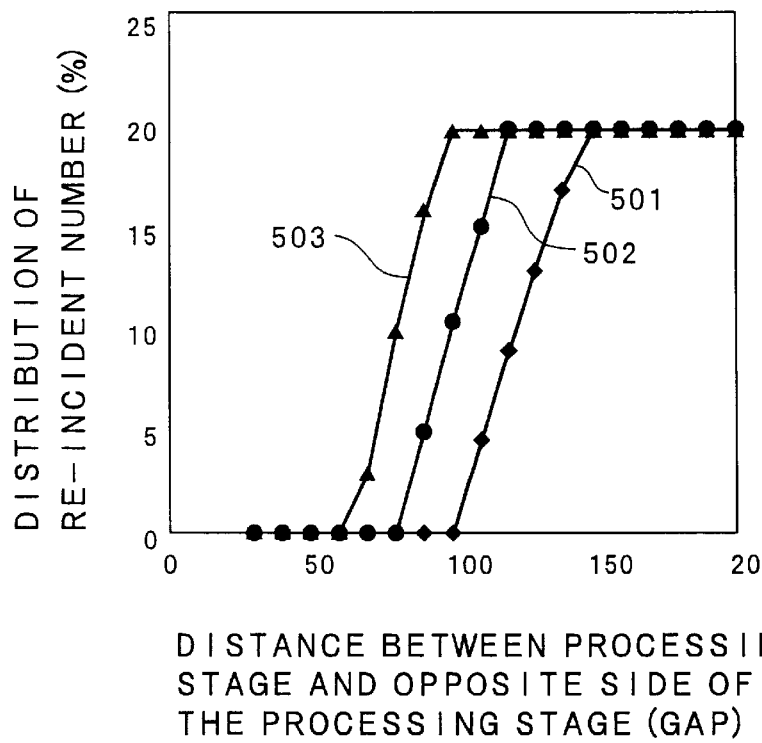
FIG. 5 is a diagram showing gap dependency of a distribution in the wafer surface of the number of re-incident times with respect to some gas flow rates.
Figure 6:
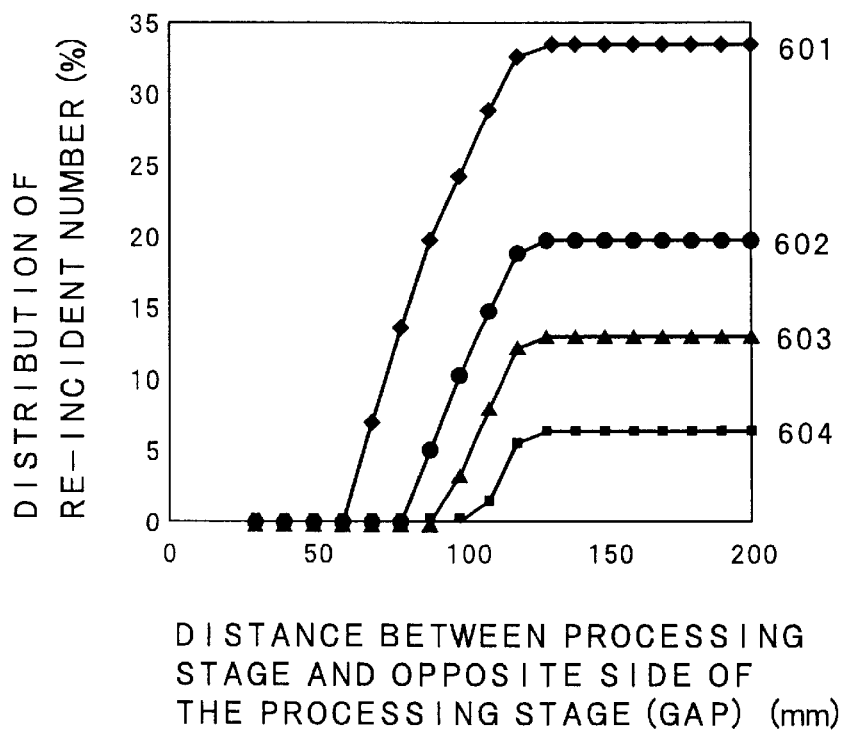
FIG. 6 is a diagram showing gap dependency of a distribution in the wafer surface of the number of re-incident times with resect to some susceptor widths.
Figure 7:
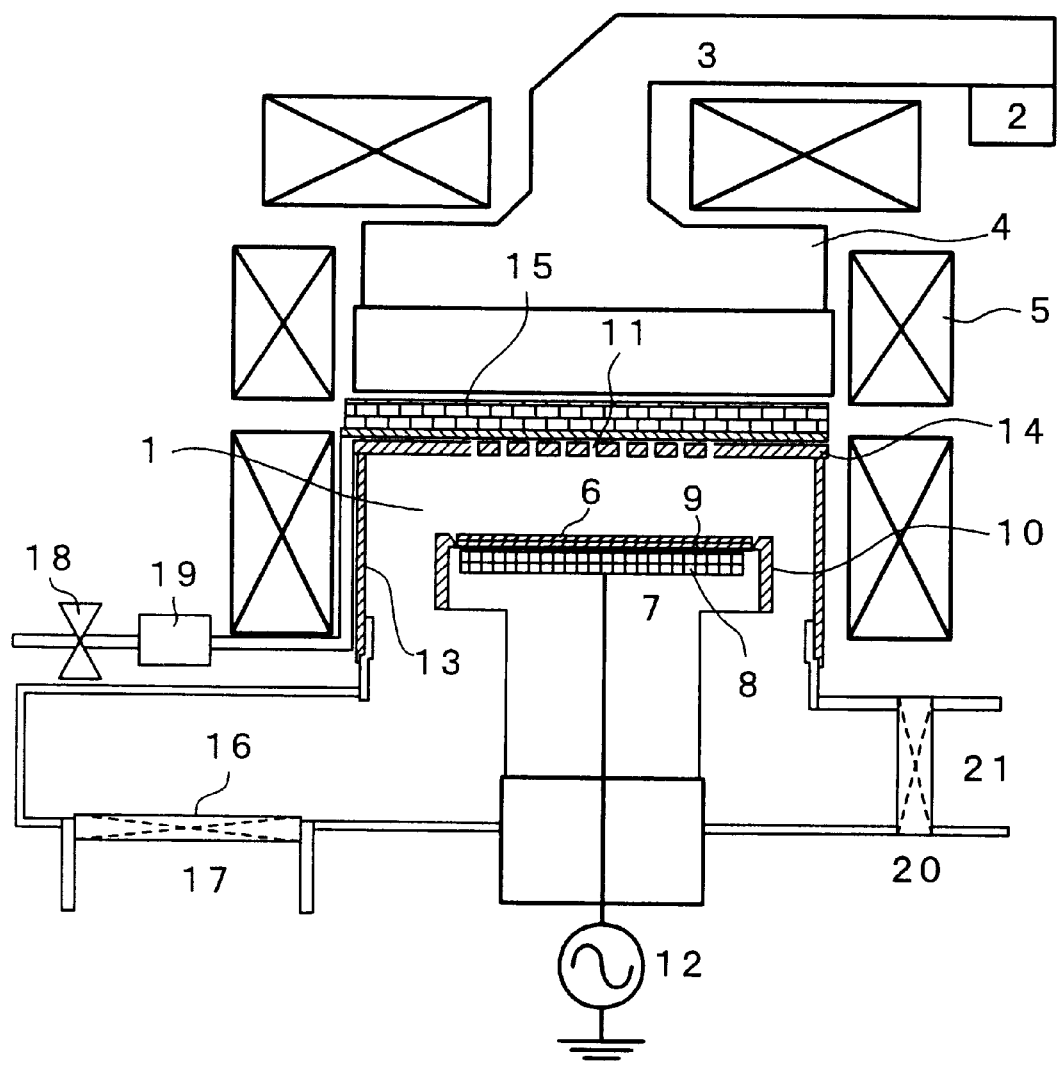
FIG. 7 is a cross section of a dry etching apparatus used in an embodiment of the invention.

A dry etching apparatus used in the invention is shown in FIG. 7. In the apparatus, an etching gas is introduced into an etching chamber 1, high frequencies from 800 MHz to 2.45 GHz are generated by a micro-wave generator 2 and transferred to the etching chamber 1 via a waveguide 3 and a cavity 4 to generate gas plasma. The cavity has a structure that its height can be arbitrarily adjusted in a range from 50 mm to 200 mm. For high-efficient discharging, two solenoid coils 5 for generating a magnetic field are disposed around the etching chamber, three coil currents are controlled so that the magnetic field of 875 gauss is applied almost just above the processing stage to generate high-density plasma by using electron cyclotron resonance. The etching chamber 1 has therein a processing stage 7 and a matter (wafer) 6 to be etched is placed on the processing stage 7 and is subjected to etching by the gas plasma. The plasma density is controlled by the power of micro-waves, and the ion current density can be controlled within the range from 0.5 mA/cm$^2$ to 20 mA/cm$^2$. In the structure, the distance between the processing stage and a shower plate 14 can be adjusted in a range from 10 mm to 200 mm. The etching gas is introduced via a mass flow controller 19 from the shower plate 14 into the etching chamber 1 and is exhausted to the outside of the etching chamber 1 by an exhaust pump 17. In the shower plate, holes 11 of gas feed each having a diameter of 1 mm for gas introduction are provided in the center portion of a diameter of 170 mm. The processing stage 7 on which the matter to be etched is placed is provided with a high-frequency power source 12 by which a high-frequency bias from 400 kHz to 13.56 MHz can be applied to a metal electrode 7 in the processing stage. An electrostatic chuck 9 is provided between the metal electrode and the matter 6 to be etched to electrically closely attach the matter to be etched to the processing stage. Further, a susceptor 10 having a width of about 20 mm is provided around the matter 6 to be etched so as to protect the matter to be etched from the plasma of the processing stage and smoothly carry the matter to be etched.

An 8-inch silicon wafer as a matter to be etched is carried into the apparatus. On the silicon wafer, an oxide silicon film having a thickness of about 500 nm, a lower TiN film of about 100 nm, an Al—Cu—Si alloy film of about 400 nm, an upper TiN film of about 100 nm, and a photoresist mask to which a mask pattern is transferred are formed. The pattern width of the photoresist mask is 200 nm. The wafer is carried to the etching apparatus, 70 sccm of chlorine gas and 30 sccm of boron trichloride gas are introduced as etching gases into the etching apparatus, and the TiN films and the Al—Cu—Si alloy film are etched in a lump in a state where the total pressure becomes 2 Pa. The temperature of the processing stage at the time of etching is set to 50° C., the micro-wave power is set to 1000 W at 2.45 GHz, and a high-frequency bias of 100 W at 800 kHz (0.3 W/cm$^2$) is applied to the wafer. The etching is performed in accordance with the order of the upper TiN, Al—Cu—Si alloy, and lower TiN. The average etch rate of the TiN films is about 400 nm/min, and that of the Al—Cu—Si alloy film is about 800 nm/min. The etch rate of the photoresist is about 300 nm/min. After the multilayered film is etched, in order to perform the process with reliability (so that there is no short circuit and no residual film), over-etching of about 30% more than the etching time is performed. The height of the cavity is set to 55 mm when the distance (gap) between the processing stage and the shower plate is 190 mm, 95 mm when the gap is 100 mm, and 125 mm when the gap is 70 mm. In such a manner, when the gap is narrowed, the height of the cavity is increased proportionally. In the apparatus, the plasma density has a distribution, so that the ion current density decreases about 10 percent in the wafer peripheral portion as compared with that in the center portion. The ion current density is about 2.5 mA/cm$^2$ in the wafer center portion and is about 2.3 mA/cm$^2$ in the peripheral portion.

When the distance (gap) between the processing stage and the shower plate is about 190 mm, Al etch rate is about 900 nm/min in the wafer peripheral portion (inside from the periphery of the wafer by 3 mm) and is about 700 nm/min in the wafer center portion. The etch rate in the wafer peripheral portion is 1.3 times as fast as that in the center portion. The uniformity of the etch rate is ±13%. Consequently, in the wafer peripheral portion, effective over-etching time is long, the etched amount of the photoresist and that of the underlayer oxide film are large. Further, the etched shape becomes a sequential taper shape in which the shape in the wafer center portion is thicker than that in the wafer peripheral portion. A variation in the wafer surface of a CD bias of an isolated line is about 100 nm.

When the distance (gap) between the processing stage and the shower plate is set to equal to or shorter than the radius of the wafer (100 mm), the etch rate in the wafer center portion increases. With the gap of 80 mm, the distribution in the surface of the etch rate becomes ±5% or lower. With the gap of about 70 mm, the etch rate in the wafer center becomes almost 900 nm/min, so that uniform etch rate can be attained. As for the etched shape, the etched shape in the wafer center portion and that in the peripheral portion are substantially the same. When the distance is further narrowed so as to be shorter than 50 mm, the pressure in the wafer center portion becomes higher than that in the peripheral portion, and the etch rate in the wafer center becomes faster than that in the peripheral portion. The uniformity of the gap 50 mm rapidly increases to about ±6% from the gap of 70 mm. When the gas pressure is increased to about 5 Pa, similar effects are also obtained. At 5 Pa, the uniformity of the etch rate becomes about ±3% with the gap of about 60 mm.

In metal interconnection process, the uniformity is improved when the gap lies in a range from the radius of the wafer to about ½ of the radius of the wafer. A preferable gap lies in a range from ⅗ to ⅘ of the wafer radius.

In the case where the film to be etched is a polysilicon film as well, it is similar to the case of the metal film except for the following points. The kinds of gases are different, the generation amount of the reaction by-products is smaller as compared with that in the metal interconnection process, and the etch rate depends on the ion current density. When 30 sccm of chlorine gas, 46 sccm of hydrobromic gas, and 6 sccm of gaseous oxygen are used as introduction gases, gas pressure is set to 0.8 Pa, micro-wave power is set to 600 W, RF bias is set to 60 W, and wafer temperature is set to 0° C., the average etch rate of the polysilicon film is about 300 nm/min. The ion current density is about 1.5 mA/cm$^2$ in the wafer center and about 1.3 mA/cm$^2$ in the peripheral portion. Since the generation amount of the reaction by-products is small and the etch rate of polysilicon is sensitive to the ion current density, the uniformity of the etch rate with the gap of 200 mm is better than that of the metal interconnection. When the uniformity is about ±6%, the etch rate in the peripheral portion becomes higher. However, there are variations in shape in the wafer surface. When the thickness of the polysilicon film is 300 nm, thickness of the gate electrode (by the CD bias) in the center is larger than that in the peripheral portion by an amount of about 50 nm. When the distance (gap) between the shower plate and the wafer is 100 mm or less, the uniformity is improved. When the gap is 90 mm, the uniformity becomes ±5% or lower. When the gap is 80 mm, the etch rate becomes uniform. When the gap is further narrowed, the etch rate in the wafer center portion becomes higher than that in the peripheral portion. When the gap is 60 mm, the uniformity of the etch rate is ±4%. When the gap is narrowed to 50 mm or less, the uniformity exceeds ±5%. With respect to the etched shape, when the gap is 80 mm, an almost uniform etched shape is obtained in the wafer surface. The uniformity of the shape when the gap is in the range from 90 mm to 70 mm is 10 nm or less. The uniformity of the etched shape is improved when the gap is from 100 mm to 50 mm. When the gas pressure is decreased to 0.1 Pa, a partial pressure of chlorine is lowered. Although the etch rate is decreased to about 250 nm/min, similar effects are obtained. When the gas pressure is further decreased, the mean free path of the gas molecule becomes longer. Consequently, even when the distance (gap) between the processing stand and the shower plate is narrowed, the uniformity is not sufficiently improved.

In the case of etching polysilicon, by setting the gap to about the radius of the wafer to about ⅗ of the radius of the wafer, the uniformity is improved. A desired gap lies in a range from ⁷⁄₁₀ to ⁹⁄₁₀ of the radius of the wafer.

Second Embodiment

Another embodiment using an apparatus of FIG. 8 will now be described. In the apparatus, an etching gas is introduced into the etching chamber 1, high frequencies ranging from 300 MHz to 900 MHz generated by a high-frequency power source 81 are introduced from an antenna 82 into the etching chamber 1 to generate gas plasma. Three solenoid coils 5 for generating a magnetic field are disposed around the etching chamber for high-efficient discharging, two coil currents are controlled so that the magnetic field of 0 to 320 gauss is applied almost just above the processing stage, and high-density plasma having an electron density of $10^{10}$/cm$^3$ or higher is generated by using electron cyclotron resonance (ECR) The etching chamber 1 has therein the processing stand 7, and the matter 6 to be etched is placed on the processing stage 7 and is subjected to etching by the gas plasma. The etching gas is introduced via the mass flow controller 19 from the shower plate 14 into the etching chamber 1 and is exhausted to the outside of the etching chamber 1 by the exhaust pump 17. In the shower plate, the holes 11 of gas feed for gas introduction are provided in the center portion of a diameter of 230 mm. The processing stage 6 on which the matter to be etched is provided with the high-frequency power source 12 by which a high-frequency bias from 400 kHz to 13.56 MHz can be applied. In the structure, the position of the processing stand can be adjusted so that the distance from the shower plate is in a range from 10 mm to 200 mm.

A 12-inch silicon wafer (having a diameter of 300 mm) as a matter to be etched is carried into the apparatus. On the silicon wafer, an oxide silicon film having a thickness of about 500 nm, a lower TiN film of about 50 nm, an Al—Cu alloy film of about 400 nm, an upper TiN film of about 100 nm, and a photoresist mask to which a mask pattern is transferred are formed. The pattern width of the photoresist mask is 150 nm. The wafer is carried to the etching apparatus, 150 sccm of chlorine gas, 50 sccm of boron trichloride gas, and 2 sccm of chloroform gas are introduced as etching gases into the etching apparatus, and the TiN films and the Al—Cu alloy film are etched in a lump in a state where the total pressure becomes 1 Pa. The temperature of the processing stage at the time of etching is set to 40° C., the micro-wave power is set to 1200 W at 450 MHz, and a high-frequency bias of 200 W at 800 kHz is applied to the wafer. The coil current is adjusted so that intensity of the magnetic field becomes 160 gauss and the gradient of the magnetic field becomes 4 gauss/cm at a position just over the wafer by 40 mm. The etching is performed in accordance with the order of the upper TiN, Al—Cu—Si alloy, and lower TiN. The average etch rate of the TiN films is about 400 nm/min, and that of the Al—Cu—Si alloy film is about 800 nm/min. The etch rate of the photoresist is about 250 nm/min. After the multilayered film is etched, in order to perform the process with reliability so that no short circuit occurs and no residual film exists, over-etching of about 30% more than the etching time is performed. In the apparatus, the plasma is almost uniform, so that the ion current density is almost uniform in the wafer surface.

When the distance between the processing stage and the shower plate is about 200 mm, Al etch rate is about 900 nm/min in the wafer peripheral portion and is about 650 nm/min in the wafer center portion. The etch rate in the wafer peripheral portion is 1.4 times as fast as that in the center portion. Consequently, in the wafer peripheral portion, effective over-etching time is long, the etched amount of the photoresist and that of the underlayer oxide film are large. Further, since the reaction by-products are re-incident often in the wafer center portion, as for the etched shape, an isolated line in the wafer center portion is thicker than that in the wafer peripheral portion by an amount of about 150 nm (CD bias amount).

When the distance (gap) between the processing stage and the shower plate is set to be equal to or shorter than 150 mm (the radius of the wafer), the etch rate in the wafer center portion increases. With the gap of 100 mm, the etch rate in the wafer surface is almost uniform and is about 900 nm/min. With the gap of 90 mm to 120 mm, the uniformity of the etch rate becomes ±5% or lower. When the gap is further narrowed to 70 mm or less, pressure variations in the wafer surface increase, and the etch rate in the center portion becomes higher than that in the peripheral portion.

In metal interconnection process, the uniformity is improved when the gap lies in a range from the radius of the wafer to about ½ of the radius of the wafer. A preferable gap lies in a range from ⅗ to ⅘ of the wafer radius.

When the gas flow rate is increased, an effect that the reaction by-product is pushed by the gas flow is produced. It can be therefore expected that when the gas flow rate is increased, the thickness of the near-surface region is reduced. Specifically, by setting the positions of the holes of gas feed of the shower plate near to the wafer center portion, the thickness of the near-surface region in the wafer center portion is reduced. The holes of gas feed in the center portion of the diameter of 230 mm in the shower plate are arranged only in the center portion of a diameter of 150 mm, and etching similar to the above is performed. When the distance (gap) between the processing stage and the shower plate is set to 150 mm or narrower, the etch rate in the wafer center starts increasing. By the effect of the gas flow in the wafer center portion, when the gap is set to about 130 mm, an almost uniform etch rate distribution can be obtained. By setting the position of the holes of gas feed of the shower plate to the center portion of a diameter of 100 mm to 200 mm, similar effects can be obtained. When the position of the holes of gas feed is set in the center portion of a diameter smaller than 100 mm, however, since the gas flow is concentrated in the wafer center portion, the etch rate in the wafer center portion becomes higher than that in the peripheral portion. On the contrary, in the case of the diameter exceeds 200 mm, the gas flow is hardly concentrated on the wafer center portion, so that the near-surface region is hardly changed by the flow. In the case of using an 8-inch wafer, when the distance between the processing stand and the shower plate is equal to or shorter than the radius of the wafer and the position of the holes of gas feed in the shower plate is in a range from about 65 mm to about 140 mm, similar effects are obtained. By setting the position of the holes of gas feed in the shower plate within a circle in the center portion having a diameter equal to ⅔ to ⅓ of the diameter of the wafer, the uniformity in the wafer surface of the etch rate is improved.

In the case of using a silicon wafer having a diameter of 400 mm, when the distance (gap) between the processing stage and the shower plate is 200 mm or less, similar effects are obtained. When the gap is 120 mm to 160 mm, an almost uniform etch rate and etched shape can be obtained in the wafer surface.

In the case of etching the polysilicon film on the 12-inch wafer, when 50 sccm of chlorine gas, 100 sccm of hydrobromic gas, and 10 sccm of gaseous oxygen are used as introduction gases, the gas pressure is set to 0.4 Pa, UHF wave power is set to 800 W, RF bias is set to 100 W at 400 kHz, and wafer temperature is set to 0° C., the average etch rate of the polysilicon film is about 300 nm/min. The uniformity is about ±7%.

When the gap lies in the range from 140 mm to 100 mm, both etch rate and etched shape become almost uniform. When the gap lies in the range from 150 mm to 80 mm, an effect of improved uniformity is obtained.

Third Embodiment

Figure 9:
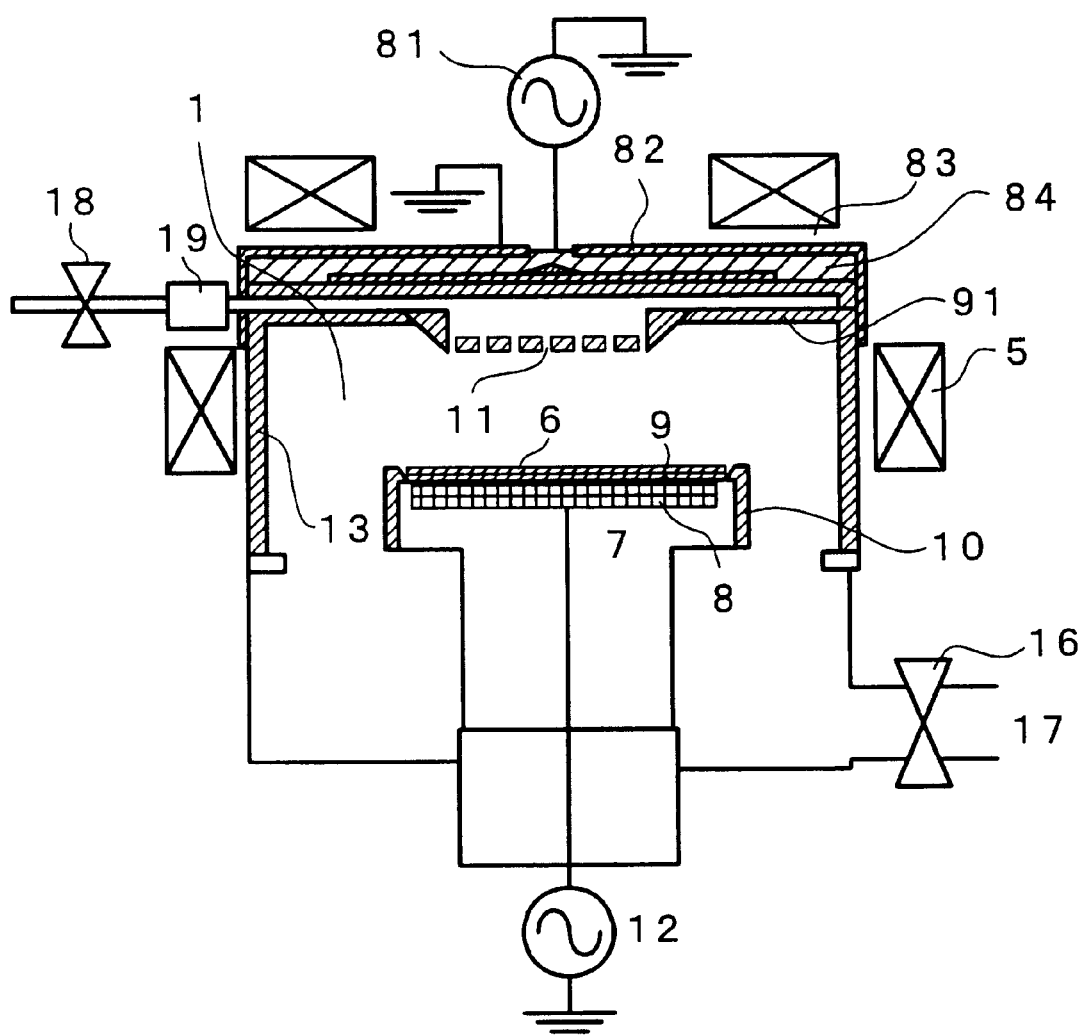
FIG. 9 is a cross section of a dry etching apparatus having a convex shower plate used in an embodiment of the invention.

A third embodiment relates to a case where an apparatus shown in FIG. 9 is used. The apparatus shown in FIG. 9 has a structure in which a gas feed portion of a shower plate 91 is projected downward (toward the wafer). The other construction is similar to that of the second embodiment. In this apparatus as well, by controlling the distance (gap) between the wafer and the gas feed portion, the near-surface region can be controlled. In the case of a 12-inch wafer, uniform etching can be performed in the wafer surface when the gap is about 100 mm. When the gap is set to about 60 mm, however, the gas pressure in the center portion becomes higher than that in the periphery, and the uniformity of the etch rate becomes ±5% or higher. In the case of etching the 12-inch wafer, it is therefore desirable to set the gap in a range from 60 mm to 100 mm.

Fourth Embodiment

Figure 10:
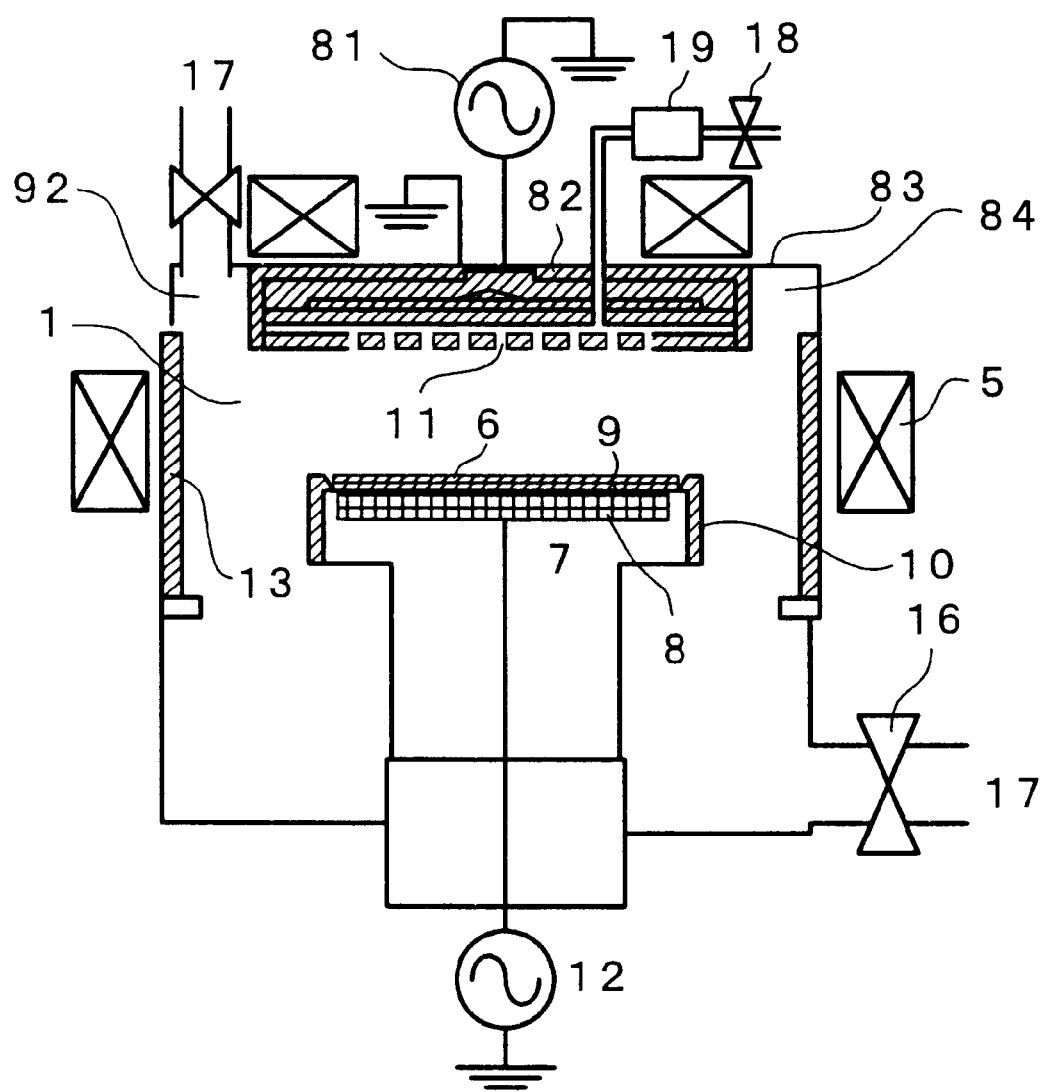
FIG. 10 is a cross section of a dry etching apparatus having an exhaust port above a wafer used in an embodiment of the invention.

A fourth embodiment relates to a case where an apparatus shown in FIG. 10 is used. In the apparatus of FIG. 10, another exhaust port 92 is provided to enhance the efficiency of exhausting. The other construction is similar to that of the apparatus used in the second embodiment. In this apparatus, the efficiency of exhausting in the peripheral portion of the wafer becomes higher as compared with that in the center portion. Consequently, the thickness of the near-surface region in the wafer peripheral portion is reduced by about 10% as compared with the apparatus of FIG. 8. In a 12-inch wafer, therefore, when the gap is about 90 mm, the etch rate and etched shape become uniform.

In the apparatus of FIG. 10, the exhaust portion 92 is provided in the upper part of the apparatus. When the exhaust port 92 is provided in a side portion, similar effects are produced. In the case where three or more exhaust ports are provided as well, similar effects are produced.

In the case where a plurality of exhaust ports are provided as described above, by setting the gap to 0.3 time to 0.6 time of the wafer diameter, the uniformity in the surface is improved.

Fifth Embodiment

Figure 11:
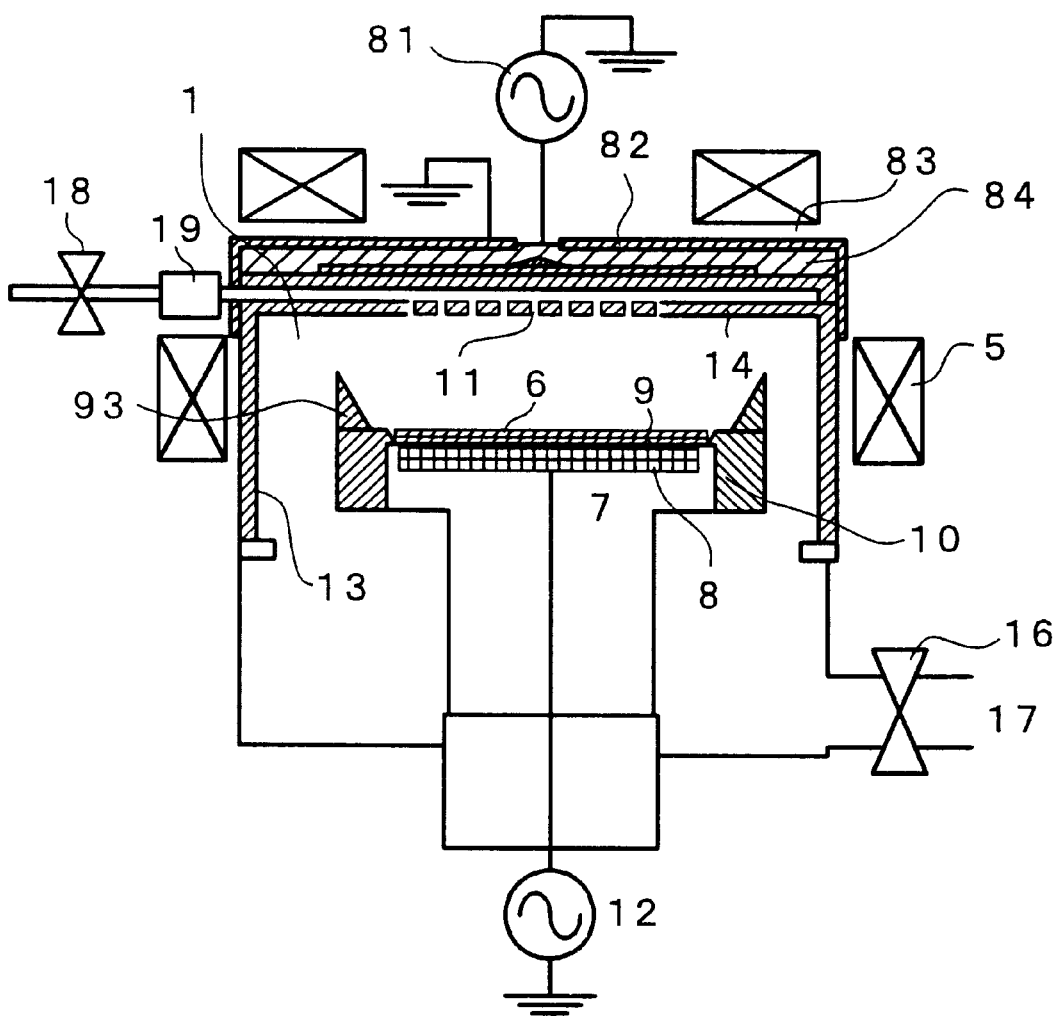
FIG. 11 is a cross section of a dry etching apparatus having a focusing ring used in an embodiment of the invention.

A fifth embodiment relates to a case where an apparatus shown in FIG. 11 is used. The apparatus of FIG. 11 has a structure in which a focusing ring 93 is mounted on the susceptor in the apparatus of FIG. 8. By the focusing ring, the height of the near-surface region is increased by an amount corresponding to the height of the focusing ring, and especially the near-surface region in the wafer peripheral portion becomes thicker. In the case of mounting a focusing ring having a height of 20 mm, in a 12-inch wafer, almost uniform etching is performed with the gap of 120 mm. As an effect of the focusing ring, in the case of a 12-inch wafer and the gap of 150 mm or narrower, an etching parameter in which the gap is narrowed by an amount corresponding to almost the height of the focusing ring is obtained. That is, each of the values of G and $G_0$ described in the means for solving the problem is increased only by an amount corresponding to the height of the focusing ring.

When the gap is 100 mm and the height of the focusing ring is set to 50 mm or higher, the flow of gas stagnates and particles occur easily on the inside of the focusing ring. With the gap of 150 mm, particles occur easily when the height is 75 mm or more. The height of the focusing ring is, desirably, equal to about the half of the gap or less. That is, in correlation with the gap, the height of the focusing ring is, desirably, 75 mm or less in the case of a 12-inch wafer.

By setting the height of the focusing lens to ¼ of the wafer diameter or less and equal to or higher than the height of the wafer, the effect of the uniformity in the wafer surface can be enhanced.

Sixth Embodiment

Figure 12:
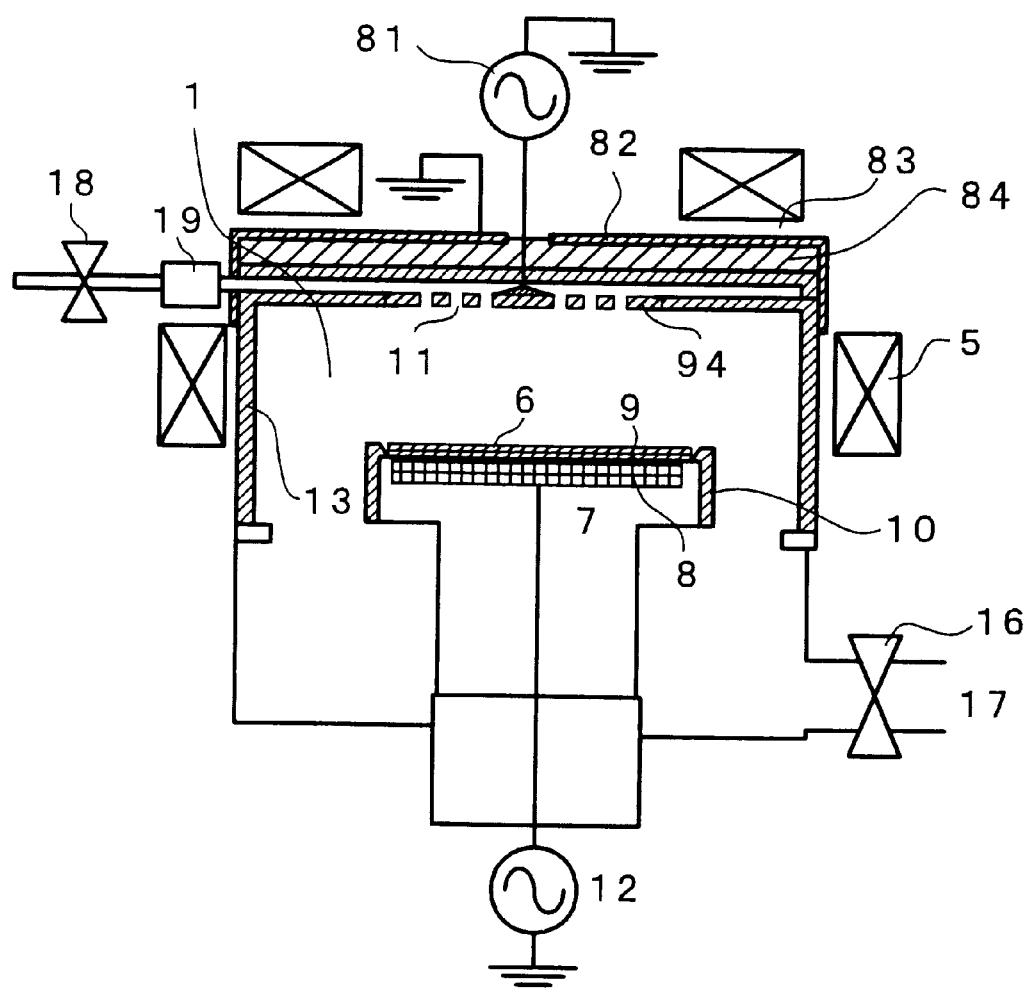
FIG. 12 is a cross section of a dry etching apparatus having a vacuum antenna used in an embodiment of the invention.

A dry etching apparatus used for the invention is shown in FIG. 12. The apparatus has a structure such that the antenna of the etching apparatus of FIG. 8 is mounted in the etching chamber. An antenna 94 has a shower plate.

A 12-inch silicon wafer as a matter to be etched is carried into the apparatus. On the silicon wafer, a silicon nitride film (nitride film) having a thickness of 0.1 μm, an oxide film ($SiO_2$) having a thickness of about 1.5 μm, and a photoresist mask to which a mask pattern is transferred are formed. Holes each having a diameter of 150 nm is formed in the photoresist mask.

In the apparatus, 300 sccm of Ar gas, 12 sccm of $C_4F_8$ gas, and 8 sccm of gaseous oxygen are introduced into the etching chamber from a gas introducing port, and the gas pressure is set to 2 Pa. High frequencies of 2 kW at 450 MHz are introduced into the etching chamber 1 by the antenna to generate gas plasma. A bias of 2.4 kW at 2 MHz is applied to the processing stage to etch the oxide film. The plasma density is $5\times10^{11}/cm^3$ and the ion current density is about 7 $mA/cm^2$. The ion current density is almost uniform in the wafer surface.

With the parameters, when the gap is 150 mm, the etch rate of the oxide film is about 750 nm/min, a selective ratio to the photoresist is 10, a selective ratio to the nitride film as an underlayer is 10 in the wafer peripheral portion. Since the etch rate of the oxide film is determined by the ion current, the distribution in the wafer surface is about ±4%. The nitride film is etched by F radicals and the etching is suppressed by CFx radicals. Since a photoresist product is similar to the composition of CFx, the etch rate of the nitride film depends on the re-incident amount of the photoresist product. The re-incident amount of the photoresist product is small in the wafer peripheral portion, so that the etch rate of the nitride film in the peripheral portion is about twice as high as that in the wafer center portion. In the center portion, the photoresist products are excessive, and the etched shape becomes a sequential taper shape. When the gap is set within the range from 120 mm to 70 mm, however, the thickness of the near-surface region is reduced in the wafer center portion and the uniformity is improved. Further, when the gap is 100 to 75 mm, the etch rate of the nitride film becomes almost uniform, and the etched shape becomes almost uniform.

A desired gap in the processing of the oxide film is about ⅔ to ½ of the radius of the wafer.

Seventh Embodiment

Figure 13:
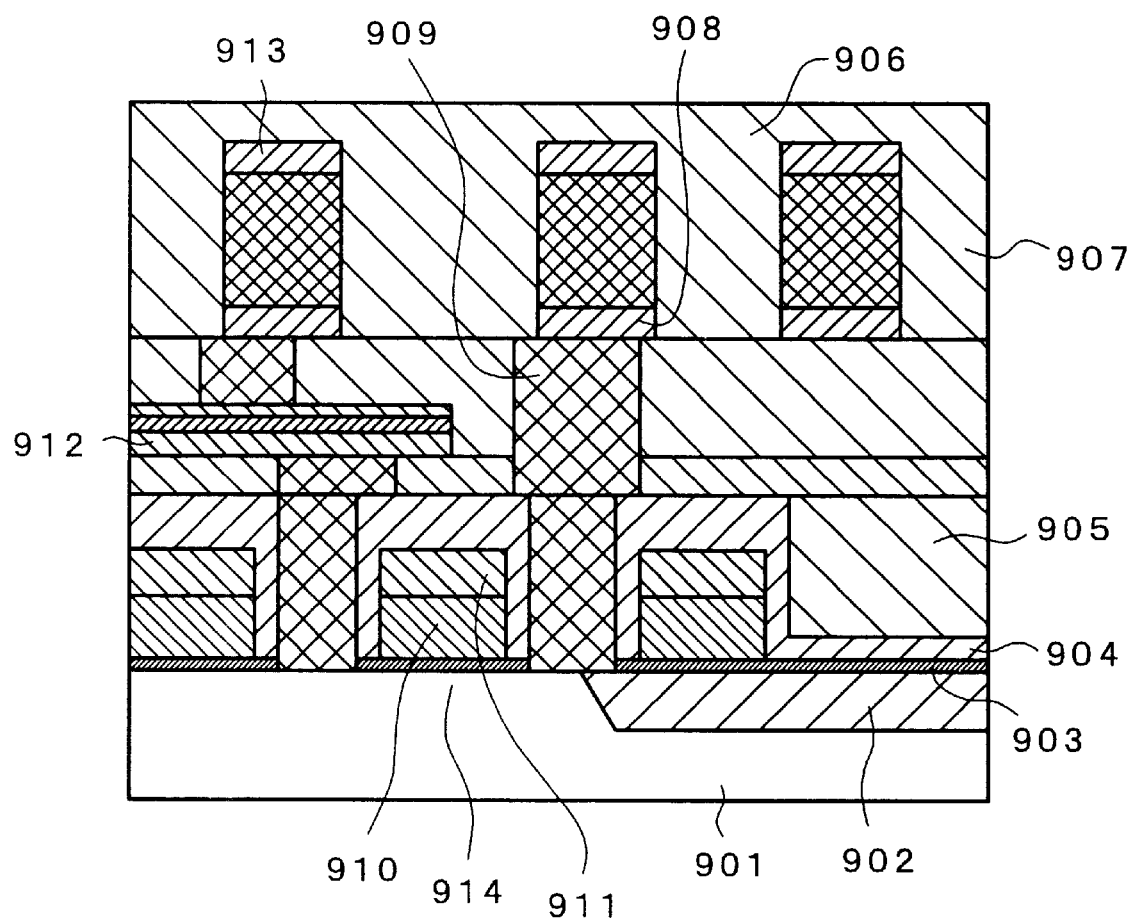
FIG. 13 is a cross section of a semiconductor device for performing etching by a dry etching method described in an embodiment of the invention.

A seventh embodiment relates to fabrication of a semiconductor device according to the dry etching method of the invention. FIG. 13 is a conceptual cross section of a semiconductor device having a gate oxide film 903, a field effect transistor structure 914 as a gate electrode made by a polysilicon film 910 and a W film 911, a capacitor 912, and a first interconnection layer 913. Shown in the diagram are a silicon substrate 901, an $SiO_2$ film 902 for device isolation, a silicon nitride film 904, an $SiO_2$ film 905 for interlayer insulation, an upper TiN film 906, an Al—Cu alloy film 907, a lower TiN film 908, a contact hole 909, and a metal interconnection 913.

The structure is processed on a 12-inch wafer by the dry etching method of the invention.

The transistor structure 914 has the gate electrode having the structure in which the polysilicon film 910 in which P is doped as an impurity and the W film are stacked. The electrode is processed by using the etching apparatus in FIG. 8 described in the second embodiment. The width of the gate electrode is about 150 nm. The gap in the etching apparatus is set to 130 mm and the stacked films of the polysilicon film and W are etched with the etching parameters of the polysilicon film described in the second embodiment, that is, the parameters using chlorine gas, hydrobromic gas, and gaseous oxygen. When W is etched, the flow rate of the chlorine gas is set to 120 sccm, the flow rate of the gaseous oxygen is set to 20 sccm, and the wafer temperature is set to 100° C. $SiO_2$ is used as the mask material.

With respect to the process of the contact hole 909, the apparatus shown in FIG. 12 is used to open a hole in the $SiO_2$ film. The diameter of the upper part of the hole is about 170 nm and that in the narrow portion is about 80 nm. The gap is set to 80 mm and etching is performed. As etching parameters, the same etching parameters as those of the oxide film described in the sixth embodiment are used. The mask material is an organic photoresist mask.

Figure 8:
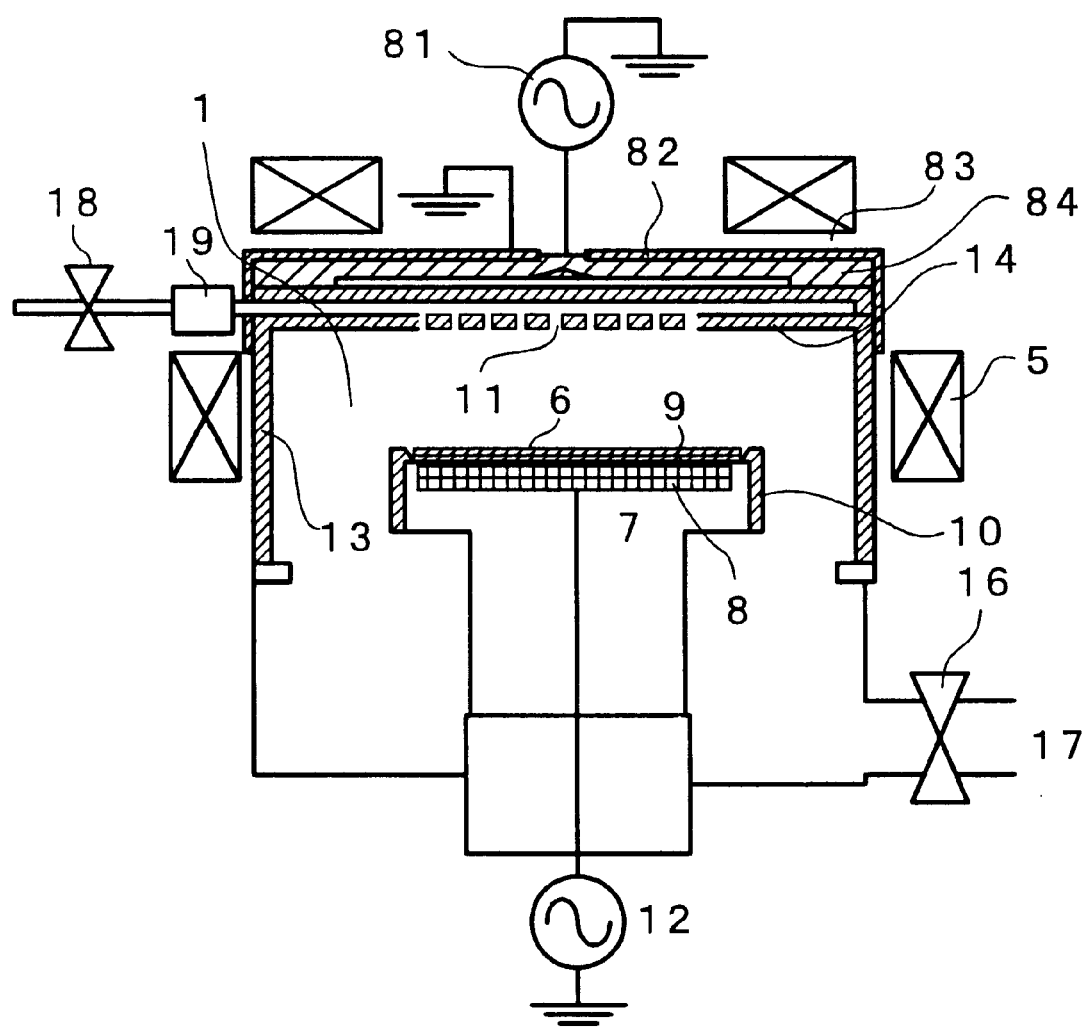
FIG. 8 is a cross section of another dry etching apparatus used in an embodiment of the invention.

The apparatus of FIG. 8 is used for the process of the interconnection layer 913. The width of the interconnection layer 913 is about 250 nm, and the three-layer structure of a TiN film, an Al—Cu alloy film, and a TiN film is used. The gap is set to 100 mm and the diameter of the shower plate is set to 230 mm. As etching parameters, the same etching parameters of the multilayer film of the TiN films and the Al—Cu alloy film on the 12-inch wafer described in the second embodiment are used. The mask material is an organic photoresist.

As described above, by using the apparatuses of the invention to form the gate electrode, contact hole, and interconnection, the semiconductor device having the structure shown in FIG. 13 is fabricated. Since the semiconductor device is uniformly processed in the wafer surface in each of the etching processes, the semiconductor device is uniform in the wafer surface.

What is claimed is:

1. A dry etching apparatus comprising:
   a chamber;
   a stage on which a matter to be etched having a diameter larger than eight inches set in said chamber is placed;
   means for introducing an etching gas into said chamber; and
   means for generating plasma of said etching gas,
   wherein a gap between said stage and a surface facing said stage is equal to or smaller than ⅔ and equal to or larger than ¼ of the diameter of said matter to be etched.

2. The dry etching apparatus according to claim 1, wherein a plurality of gas introducing holes for introducing said etching gas are formed in the surface facing said matter to be etched.

3. The dry etching apparatus according to claim 1, wherein said plurality of gas introducing holes are formed in an almost center portion of said matter to be etched, and the diameter as a whole of said plurality of gas introducing holes is equal to or larger than ⅓ and is equal to or smaller than ⅔ of the diameter of said matter to be etched.

4. The dry etching apparatus according to claim 1, wherein the diameter of said matter to be etched is 300 mm or larger.

5. The dry etching apparatus according to claim 1, wherein said matter to be etched is a matter to be etched having a surface on which a metal film is formed.

6. The dry etching apparatus according to claim 1, wherein said means for generating plasma of said etching gas is means using a high frequency power in a range from 300 MHz to 900 MHz and an electromagnetic coil installed around said chamber and introducing said high frequency power from a metal plate provided in said chamber.

7. A dry etching apparatus comprising:

a chamber;

a stage on which a matter to be etched having a diameter larger than eight inches set in said chamber is placed;

means for introducing an etching gas into said chamber; and means for generating plasma of said etching gas, wherein a gap between said stage and a surface facing said stage is equal to or smaller than ½ and equal to or larger than ¼ of the diameter of said matter to be etched stage and a surface facing said stage is equal to or smaller than ½ and equal to or larger than ¼ of the diameter of said matter to be etched.

8. The dry etching apparatus according to claim 7, wherein a plurality of gas introducing holes for introducing said etching gas are formed in the surface facing said stage.

9. The dry etching apparatus according to claim 8, wherein said plurality of gas introducing holes are formed in an almost center portion of said matter to be etched, and the diameter as a whole of said plurality of gas introducing holes is in a range from ⅓ to ⅔ of the diameter of said matter to be etched.

10. The dry etching apparatus according to claim 7, wherein the diameter of said matter to be etched is 300 mm or larger.

11. The dry etching apparatus according to claim 7, wherein said matter to be etched is a matter to be etched having a surface on which a metal film is formed.

12. The dry etching apparatus according to claim 7, wherein said means for generating plasma of said etching gas is means using a high frequency power in a range from 300 MHz to 900 MHz and an electromagnetic coil installed around said chamber and introducing said high frequency power from a metal plate provided in said chamber.

13. A dry etching apparatus comprising:

a chamber;

means for introducing an etching gas into said chamber;

a stage for placing a wafer in said chamber, the wafer having a diameter of 12 inches or larger and a film containing aluminum formed on its surface; and means for generating plasma of said etching gas, wherein a gap between said wafer and a surface facing said wafer is equal to or larger than ⅗ and equal to or smaller than ⅘ of the radius of said wafer.

14. A dry etching apparatus comprising:

a chamber;

means for introducing an etching gas into said chamber;

a stage for placing a wafer in said chamber, the wafer having a diameter of 12 inches or larger and a silicon film formed on its surface; and means for generating plasma of said etching gas, wherein a gap between said wafer and a surface facing said wafer is equal to or larger than 7/10 and equal to or smaller than 9/10 of the radius of said wafer.

15. A dry etching apparatus comprising:

a chamber;

means for introducing an etching gas into said chamber;

a stage for placing a wafer in said chamber, the wafer having a diameter of 12 inches or larger and a silicon oxide film formed on its surface; and means for generating plasma of said etching gas, wherein a gap between said wafer and a surface facing said wafer is equal to or larger than ½ and equal to or smaller than ⅔ of the radius of said wafer.

16. A dry etching apparatus comprising:

a chamber;

a stage on which a matter to be etched having a diameter larger than eight inches set in said chamber is placed; and a focusing ring, provided around said stage, having a height higher than said matter to be etched and equal to or shorter than the half of a distance between said matter to be etched and a surface facing said matter.

17. The dry etching apparatus according to claim 16, wherein said height is equal to or less than ¼ of the diameter of said matter to be etched.

18. A dry etching apparatus comprising:

a chamber;

a stage on which a matter to be etched set in said chamber is placed;

means for introducing an etching gas into said chamber;

means for generating plasma of said etching gas; and a plurality of exhaust ports for exhausting said etching gas, wherein a distance between said matter to be etched and a surface facing said matter to be etched is in a range from 0.3 time to 0.6 time of the diameter of said matter to be etched.

19. The dry etching apparatus according to claim 18, wherein the diameter of said matter to be etched is 12 inches or larger.

20. A dry etching apparatus comprising:

a chamber;

a stage on which a matter to be etched having a diameter larger than eight inches set in said chamber is placed;

means for introducing an etching gas into said chamber; and means for generating plasma of said etching gas, wherein the means for introducing said etching gas has the form of a shower plate having a plurality of introducing holes, said shower plate is provided in a convex state on a surface facing said matter to be etched so that as to bulge out toward said matter to be etched, and a gap between said matter to be etched and said shower plate is in a range from ¼ to ½ of the diameter of said matter to be etched.

21. The dry etching apparatus according to claim 20, wherein the diameter of said matter to be etched is 12 inches or larger.

22. The dry etching apparatus according to claim 20, wherein said gap is in a range from 60 mm to 100 mm.

23. A dry etching apparatus according to claim 20, wherein said plurality of introducing holes are provided in an almost center portion of said matter to be etched, and the diameter of said plurality of introducing holes as a whole is in a range from ⅓ to ⅔ of the diameter of said matter to be etched.

24. The dry etching apparatus according to claim 23, wherein the means for generating plasma is means for applying a power in a UHF band.

25. The dry etching apparatus according to claim 23, wherein a metal film is formed on the surface of said matter to be etched.

26. The dry etching apparatus comprising:

a chamber;

a stage on which a matter to be etched set in said chamber is placed;

means for introducing an etching gas into said chamber; and means for generating plasma of said etching gas by electron cyclotron resonance, wherein said matter to be etched is a wafer having a diameter of 12 inches, and a gap between said stage and a surface facing said stage is in a range from 55 mm to 120 mm.

27. The dry etching apparatus according to claim 26, wherein the means for introducing an etching gas into said chamber is means for introducing said etching gas from a plurality of gas introducing holes, said plurality of introducing holes are provided in an almost center portion of said wafer, and the diameter of said plurality of introducing holes as a whole is in a range from ⅓ to ⅔ of the diameter of said wafer.

28. A dry etching apparatus comprising:

a chamber;

a stage on which a matter to be etched set in said chamber is placed;

means for introducing an etching gas into said chamber; and means for generating plasma of said etching gas by electron cyclotron resonance, wherein said matter to be etched is a wafer having a diameter of 16 inches, and a gap between said stage and a surface facing said stage is in a range from 50 mm to 170 mm.

29. A method for fabricating a semiconductor device, comprising:

a step of placing a matter to be etched in a chamber; and a step of introducing an etching gas into said chamber, generating plasma of said etching gas, and dry etching the surface of said matter to be etched by controlling thickness of a near-surface region by controlling a distance between said matter to be etched and a surface facing said matter to be etched, wherein the relations of said distance G mm, the radius R (mm) of said matter to be etched, pressure P (Pa) of said etching gas, and flow rate Q (cm³/min) of said etching gas are as follows:

$$G < R \times 0.9^{(Q-100)/100} \times 0.95^{(P-1)}.$$

30. A method for fabricating a semiconductor device, comprising:

a step of placing a matter to be etched in a chamber; and a step of introducing an etching gas into said chamber, generating plasma of said etching gas, and dry etching the surface of said matter to be etched by controlling thickness of a near-surface region by controlling a distance between said matter to be etched and a surface facing said matter to be etched, wherein a susceptor is provided around said matter to be etched, and the relation between said distance G (mm) and width D (cm) of said susceptor is as follows:

$$G \cdot R \times 0.9^{(Q-100)/100} \times 0.95^{(P-1)} \times (0.5 + 0.12 \times D^{0.5}).$$

31. A method for fabricating a semiconductor device, comprising:

a step of placing a matter to be etched in a chamber; and a step of introducing an etching gas into said chamber, generating plasma of said etching gas, and dry etching the surface of said matter to be etched by controlling thickness of a near-surface region by controlling a distance between said matter to be etched and a surface facing aid matter to be etched, wherein a focusing ring is provided around said matter to be etched, and the relation between said distance G (mm) and the height H (mm) of said focusing ring is as follows:

$$R \times 0.9^{(Q-100)/100} \times 0.95^{(P-1)} \times (0.5 + 0.12 \times D^{0.5}) + H \cdot G \cdot R \times 0.9^{(Q-100)/100} \times 0.95^{(P-1)} + H.$$

32. A method for fabricating a semiconductor device, comprising:

a step of placing a matter to be etched having a diameter exceeding 8 inches in a chamber; and a step of introducing an etching gas into said chamber, generating plasma of said etching gas, and dry etching the surface of said matter to be etched by controlling a distance between said matter to be etched and a surface facing said matter to be etched to be in a range from ¼ to ½ of the diameter of said matter to be etched.

33. The method for fabricating a semiconductor device according to claim 32, wherein pressure of said etching gas is in a range from 0.1 Pa to 5 Pa.

34. The method for fabricating a semiconductor device according to claim 32, wherein said matter to be etched is a substrate having a surface on which a metal film is formed.

35. The method for fabricating a semiconductor device according to claim 32, wherein said matter to be etched is a substrate having a surface on which any one of an aluminum film, an alloy film containing aluminum, a titanium nitride film, a silicon film and a silicon oxide film is formed.

36. The method for fabricating a semiconductor device according to claim 32, wherein said plasma is generated by application of a high-frequency power, and the frequency of said high-frequency power is equal to or higher than 300 MHz and equal to or lower than 900 MHz.

37. A method for fabricating a semiconductor device, comprising:

a step of placing a matter to be etched having a diameter exceeding 8 inches in a chamber; and a step of introducing an etching gas into said chamber, generating plasma of said etching gas, and dry etching the surface of said matter to be etched by controlling the distance between said matter to be etched and a surface facing said matter to be etched to be equal to or smaller than ⅔ and equal to or larger than ¼ of the diameter of said matter to be etched.

38. A method for fabricating a semiconductor device, comprising:

a step of forming an aluminum film or an aluminum alloy film on a semiconductor wafer having a diameter of 300 mm or larger;

a step of placing said semiconductor wafer on which said aluminum film or said aluminum film alloy is formed into an etching chamber; and a step of dry etching said aluminum or said aluminum film alloy with a distance between said aluminum film or said aluminum film alloy and a surface facing said semiconductor wafer being within a range from ⅗ to ⅘ of the radius of said semiconductor wafer.

39. A method for fabricating a semiconductor device, comprising:

a step of forming a silicon film on a semiconductor wafer having a diameter of 300 mm or larger;

a step of placing said semiconductor wafer on which said silicon film is formed into an etching chamber; and a step of dry etching said silicon film with distance between said silicon film and a surface facing said semiconductor wafer being within a range from 7/10 to 9/10 of the radius of said semiconductor wafer.

40. A method for fabricating a semiconductor device, comprising:

a step of forming a silicon oxide film on a semiconductor wafer having a diameter of 300 mm or larger;

a step of placing said semiconductor wafer on which said silicon oxide film is formed into an etching chamber; and a step of dry etching said silicon oxide film with a distance between said silicon oxide film and a surface facing said semiconductor wafer being within a range from 1/2 to 2/3 of the radius of said semiconductor wafer.

41. A dry etching apparatus comprising:

a chamber;

a stand on which a matter to be etched set in said chamber is placed;

a plurality of gas introducing holes for introducing an etching gas into said chamber, having a center axis being provided almost coaxially with a center axis of said matter to be etched and a diameter of the whole of the plurality of gas introducing holes being in a range from 1/3 to 2/3 of the diameter of the matter to be etched;

a gas exhaust port for exhausting the gas in said chamber; and plasma generating means for generating plasma of said etching gas.

42. The dry etching apparatus according to claim 41, wherein distance between said stand and a surface facing said stand is equal to or shorter than 2/3 of the diameter of said matter to be etched.

43. The dry etching apparatus according to claim 41, wherein distance between said stand and a surface facing said stand is equal to or longer than 1/4 of the diameter of said matter to be etched.

44. A method for fabricating a semiconductor device, comprising:

a step of placing a wafer in an etching chamber; and a step of introducing an etching gas from a plurality of gas introducing holes into said etching chamber, a center axis of the plurality of gas introducing holes being provided coaxially with a center axis of said wafer and a diameter of the whole of the plurality of gas introducing holes being in a range from 1/3 to 2/3 of the diameter of said wafer, generating plasma of said etching gas, and dry etching said wafer surface with said plasma.

* * * * *